`US011440605B2`

(12) United States Patent
Inose et al.

(10) Patent No.: US 11,440,605 B2
(45) Date of Patent: Sep. 13, 2022

(54) CONTROL UNIT ARRANGEMENT STRUCTURE FOR SADDLE RIDING-TYPE VEHICLE

(71) Applicant: HONDA MOTOR CO., LTD., Tokyo (JP)

(72) Inventors: Koji Inose, Wako (JP); Yuichi Takeda, Wako (JP); Daisuke Sugio, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/967,788

(22) PCT Filed: Mar. 7, 2019

(86) PCT No.: PCT/JP2019/009126
§ 371 (c)(1),
(2) Date: Aug. 6, 2020

(87) PCT Pub. No.: WO2019/172380
PCT Pub. Date: Sep. 12, 2019

(65) Prior Publication Data
US 2021/0044063 A1 Feb. 11, 2021

(30) Foreign Application Priority Data
Mar. 7, 2018 (JP) .............................. JP2018-041190

(51) Int. Cl.
*H01R 13/60* (2006.01)
*B62J 11/19* (2020.01)
(Continued)

(52) U.S. Cl.
CPC ................ *B62J 11/19* (2020.02); *B62J 11/00* (2013.01); *B62J 40/00* (2020.02); *B62J 40/10* (2020.02);
(Continued)

(58) Field of Classification Search
CPC ................ H01R 23/722; H01R 23/725; H01R 13/6392; H01R 13/6395; H01R 31/06;
(Continued)

(56) References Cited

U.S. PATENT DOCUMENTS 2,860,314 A * 11/1958 Daniels .................... G09C 1/12
439/189
3,737,833 A * 6/1973 Jerominek ........... H01R 12/592
439/61

(Continued)

FOREIGN PATENT DOCUMENTS

CN 201138713 10/2008
CN 201863928 6/2011
(Continued)

OTHER PUBLICATIONS

International Search Report and Written Opinion for International Application No. PCT/JP2019/009126 dated May 28, 2019, 6 pages.
(Continued)

*Primary Examiner* — Thanh Tam T Le
(74) *Attorney, Agent, or Firm* — Amin, Turocy & Watson, LLP

(57) ABSTRACT

A control unit arrangement structure for a saddle riding-type vehicle includes a control unit (30) mounted in a saddle riding-type vehicle (1), and a plurality of connectors (40) connected to the control unit (30), wherein the control unit (30) includes a plurality of joining parts (34) which transmit electric signals, the plurality of joining parts (34) are respectively connected to the plurality of connectors (40), an outer periphery of the control unit (30) is disposed inward from an outer peripheries of the connectors (40) when seen in a connection direction (Vc) between the joining parts (34) and the connectors (40), and a single support member (50) which supports the plurality of connectors (40) is provided.

6 Claims, 7 Drawing Sheets

(51) Int. Cl.
| | |
|---|---|
| *B62J 45/00* | (2020.01) |
| *H01R 13/621* | (2006.01) |
| *H01R 13/639* | (2006.01) |
| *H01R 13/73* | (2006.01) |
| *H01R 31/06* | (2006.01) |
| *B62J 45/20* | (2020.01) |
| *B62J 11/00* | (2020.01) |
| *B62J 40/10* | (2020.01) |
| *B62J 40/00* | (2020.01) |
| *H01R 12/72* | (2011.01) |
| *H01R 12/75* | (2011.01) |
| *H05K 1/11* | (2006.01) |

(52) U.S. Cl.
CPC .............. *B62J 45/00* (2020.02); *B62J 45/20* (2020.02); *H01R 13/6215* (2013.01); *H01R 13/639* (2013.01); *H01R 13/73* (2013.01); *H01R 31/065* (2013.01); *H01R 12/721* (2013.01); *H01R 12/75* (2013.01); *H01R 2201/26* (2013.01); *H05K 1/117* (2013.01)

(58) Field of Classification Search
CPC ...... H01R 13/732; H01R 13/73; H01R 13/74; H01R 13/6215; H01R 13/639; H05K 1/117
See application file for complete search history.

(56) References Cited

U.S. PATENT DOCUMENTS

| | | | | | |
|---|---|---|---|---|---|
| 4,226,491 | A * | 10/1980 | Kazama | ................... | H05K 1/02 361/759 |
| 4,917,625 | A * | 4/1990 | Haile | ................... | H01R 13/639 439/358 |
| 4,938,710 | A * | 7/1990 | Aihara | ................. | H01R 13/639 439/345 |
| 4,940,423 | A * | 7/1990 | Aihara | ................. | H01R 13/639 439/345 |
| 5,123,862 | A * | 6/1992 | Suzuki | ............... | H01R 13/5202 439/533 |
| 5,195,900 | A * | 3/1993 | Kumagai | ........... | H01R 13/6215 248/185.1 |
| 5,412,248 | A * | 5/1995 | Murari | ................... | B60R 16/02 257/692 |
| 5,975,933 | A * | 11/1999 | Yamaguchi | ............. | B60R 15/02 439/247 |
| 6,341,966 | B1 * | 1/2002 | Takada | ................... | H01R 12/52 439/108 |
| 6,398,589 | B1 * | 6/2002 | Congelliere | ....... | H01R 13/6397 439/655 |
| 6,561,821 | B1 * | 5/2003 | Yu | .......................... | H01R 31/06 439/74 |
| 6,929,517 | B2 * | 8/2005 | Tsai | ....................... | H01R 4/363 439/527 |
| 7,044,748 | B2 * | 5/2006 | Korsunsky | ............... | H05K 1/14 439/631 |
| 7,223,106 | B2 * | 5/2007 | Nakajima | .......... | H01R 13/6215 411/178 |
| 7,232,317 | B2 * | 6/2007 | Ookura | ................ | H01R 13/506 439/74 |
| 7,354,297 | B2 * | 4/2008 | Tsukashima | ......... | H01R 13/595 439/368 |
| 7,473,141 | B2 * | 1/2009 | Liao | ........................ | H01R 13/62 439/638 |
| 7,909,661 | B2 * | 3/2011 | Wu | ....................... | H01R 12/721 439/701 |
| 7,967,618 | B2 * | 6/2011 | Chang | ................ | H01R 12/7005 439/157 |
| 8,535,082 | B2 * | 9/2013 | Lifson | ................ | H01R 13/6392 439/369 |
| 10,021,796 | B2 * | 7/2018 | Yang | .................. | H01R 13/5202 |
| 2015/0349461 | A1 | 12/2015 | Arimai et al. | | |
| 2017/0171994 | A1 | 6/2017 | Yang et al. | | |

FOREIGN PATENT DOCUMENTS

| | | |
|---|---|---|
| CN | 102201624 | 9/2011 |
| CN | 105453708 | 3/2016 |
| CN | 206422300 | 8/2017 |
| CN | 206976656 | 2/2018 |
| JP | 07-245155 | 9/1995 |
| JP | 2002-205610 | 7/2002 |
| JP | 2003-063325 | 3/2003 |
| JP | 2006-123656 | 5/2006 |
| JP | 2013-212049 | 10/2013 |
| JP | 2015-030437 | 2/2015 |
| JP | 2015-225767 | 12/2015 |
| JP | 2016-068839 | 5/2016 |
| WO | 2015/019423 | 2/2015 |

OTHER PUBLICATIONS

Chinese Office Action for Chinese Patent Application No. 201980015873.0 dated Apr. 27, 2021.
Japanese Notice of Allowance for Japanese Patent Application No. 2020-505114 dated Sep. 7, 2021.

* cited by examiner

CONTROL UNIT ARRANGEMENT STRUCTURE FOR SADDLE RIDING-TYPE VEHICLE

TECHNICAL FIELD

The present invention relates to a control unit arrangement structure for a saddle riding-type vehicle.

Priority is claimed on Japanese Patent Application No. 2018-041190, filed Mar. 7, 2018, the content of which is incorporated herein by reference.

BACKGROUND ART

Conventionally, there is a control unit arrangement structure for a saddle riding-type vehicle disclosed in, for example, Patent Document 1. Here, an engine control unit (ECU) which is a control unit is supported by suspension stays mounted on right and left pivot frames.

RELATED ART DOCUMENT

Patent Document

Patent Document 1: Japanese Unexamined Patent Application, First Publication No. 2016-68839

SUMMARY

Problems to be Solved by the Invention

However, in the control unit arrangement structure for a straddle riding-type vehicle, when a plurality of connectors connected to a control unit which is a heavy object are supported on a vehicle body, each of the connectors may resonate. Thus, it is required to curb the resonance of each of the connectors and to improve earthquake-resistant performance of the control unit.

Therefore, an object of the present invention is to improve vibration resistance performance (vibration toughness) of a control unit in a control unit arrangement structure for a saddle riding-type vehicle.

Means for Solving the Problem

An aspect of the present invention employs the following configurations.

(1) A control unit arrangement structure for a saddle riding-type vehicle according to an aspect of the invention includes a control unit (30) mounted in a saddle riding-type vehicle, and a plurality of connectors (40) connected to the control unit (30), wherein the control unit (30) includes a plurality of joining parts (34) which transmit electrical signals, the plurality of joining parts (34) are connected to the plurality of connectors (40), an outer periphery of the control unit (30) is disposed inward from an outer periphery of the connector (40) when seen in a connection direction (Vc) between the joining part (34) and the connector (40), and a single support member (50) which supports the plurality of connectors (40) is provided.

(2) In the control unit arrangement structure for a saddle riding-type vehicle according to the aspect of (1), each of the control unit (30) and the connector (40) may have a long side (Ls) and a short side (Ss) when seen in the connection direction (Vc), and the support member (50) may be disposed to overlap the long side (Ls) of the connector (40) when seen in the connection direction (Vc).

(3) In the control unit arrangement structure for a saddle riding-type vehicle according to the aspect of (2), the support member (50) may be disposed to overlap each of the long side (Ls) and the short side (Ss) of the connector (40) when seen in the connection direction (Vc).

(4) In the control unit arrangement structure for a saddle riding-type vehicle according to the aspect of any one of (1) to (3), the control unit (30) may have a rectangular shape in a top view, and the plurality of joining parts (34) may be disposed on facing sides of the control unit (30).

(5) In the control unit arrangement structure for a saddle riding-type vehicle according to the aspect of any one of (1) to (4), the control unit (30) may be disposed at a center position (CL) of the vehicle in a top view, and the plurality of connectors (40) may be disposed on right and left sides of the control unit (30).

(6) In the control unit arrangement structure for a saddle riding-type vehicle according to the aspect of any one of (1) to (5), an air cleaner (60) disposed above a heat source (10) may be further included, and the control unit (30) may be provided at an upper portion of the air cleaner (60).

(7) In the control unit arrangement structure for a saddle riding-type vehicle according to the aspect of (6), a concave part (61) which is recessed to accommodate the control unit (30) and the plurality of connectors (40) may be provided in the upper portion of the air cleaner (60).

(8) In the control unit arrangement structure for a saddle riding-type vehicle according to the aspect of (6) or (7), a convex part (55) which positions the support member (50) may be provided on the support member (50), and a second concave part (63) which is recessed to accommodate the convex part (55) may be provided in the upper portion of the air cleaner (60).

Advantage of the Invention

According to the control unit arrangement structure for a saddle riding-type vehicle according to the aspect of (1) of the present invention, since vibration phases of the plurality of connectors are the same as each other because the single support member which supports the plurality of connectors is provided, resonance of the respective connectors is curbed. Thus, the control unit is restricted from moving with respect to each of the connectors. Therefore, vibration resistance performance of the control unit can be improved.

According to the control unit arrangement structure for a saddle riding-type vehicle according to the aspect of (2) of the present invention, since the support member is disposed to overlap the long side of the connector when seen in the connection direction between the joining parts and the connectors, and thus the support member can support a wide range of the connector, the resonance of each of the connectors can be curbed more effectively.

According to the control unit arrangement structure for a saddle riding-type vehicle according to the aspect of (3) of the present invention, since the support member is disposed to overlap each of the long side and the short side of the connector when seen in the connection direction, the resonance of each of the connectors can be curbed more effectively as compared with a case in which the support member is disposed to overlap only the long side of the connector. That is, it is effective in curbing vibration in all directions.

According to the control unit arrangement structure for a saddle riding-type vehicle according to the aspect of (4) of the present invention, since the control unit has a rectangular shape in a top view, and the plurality of joining parts are disposed on the facing sides of the control unit, the control unit can be stably supported as compared with a case where the plurality of joining parts are disposed only on one side of the control unit.

According to the control unit arrangement structure for a saddle riding-type vehicle according to the aspect of (5) of the present invention, since the control unit is disposed at the center position of the vehicle in a top view, and the plurality of connectors are disposed on the right and left sides of the control unit, as compared with a case in which the control unit is disposed at a position deviated from the center position of the vehicle in the top view, wiring lengths of right and left harnesses connected to the connectors can be shortened. In addition, a weight balance of the vehicle in a right and left direction can be improved.

According to the control unit arrangement structure for a saddle riding-type vehicle according to the aspect of (6) of the present invention, since the air cleaner disposed above the heat source is further provided, and the control unit is provided above the air cleaner, the control unit can be kept away from the heat source, and thus a heat effect on the control unit can be curbed.

According to the control unit arrangement structure for a saddle riding-type vehicle according to the aspect of (7) of the present invention, since the concave part which is recessed to accommodate the control unit and the plurality of connectors is provided in the upper portion of the air cleaner, positioning can be easily performed by accommodating the control unit and the plurality of connectors in the concave part.

According to the control unit arrangement structure for a saddle riding-type vehicle according to the aspect of (8) of the present invention, since the convex part which positions the support member is provided on the support member, and the second concave part which is recessed to accommodate the convex part is provided in the upper portion of the air cleaner, the positioning can be easily performed by accommodating the convex part in the second concave part.

DESCRIPTION OF THE EMBODIMENTS

Figure 1:
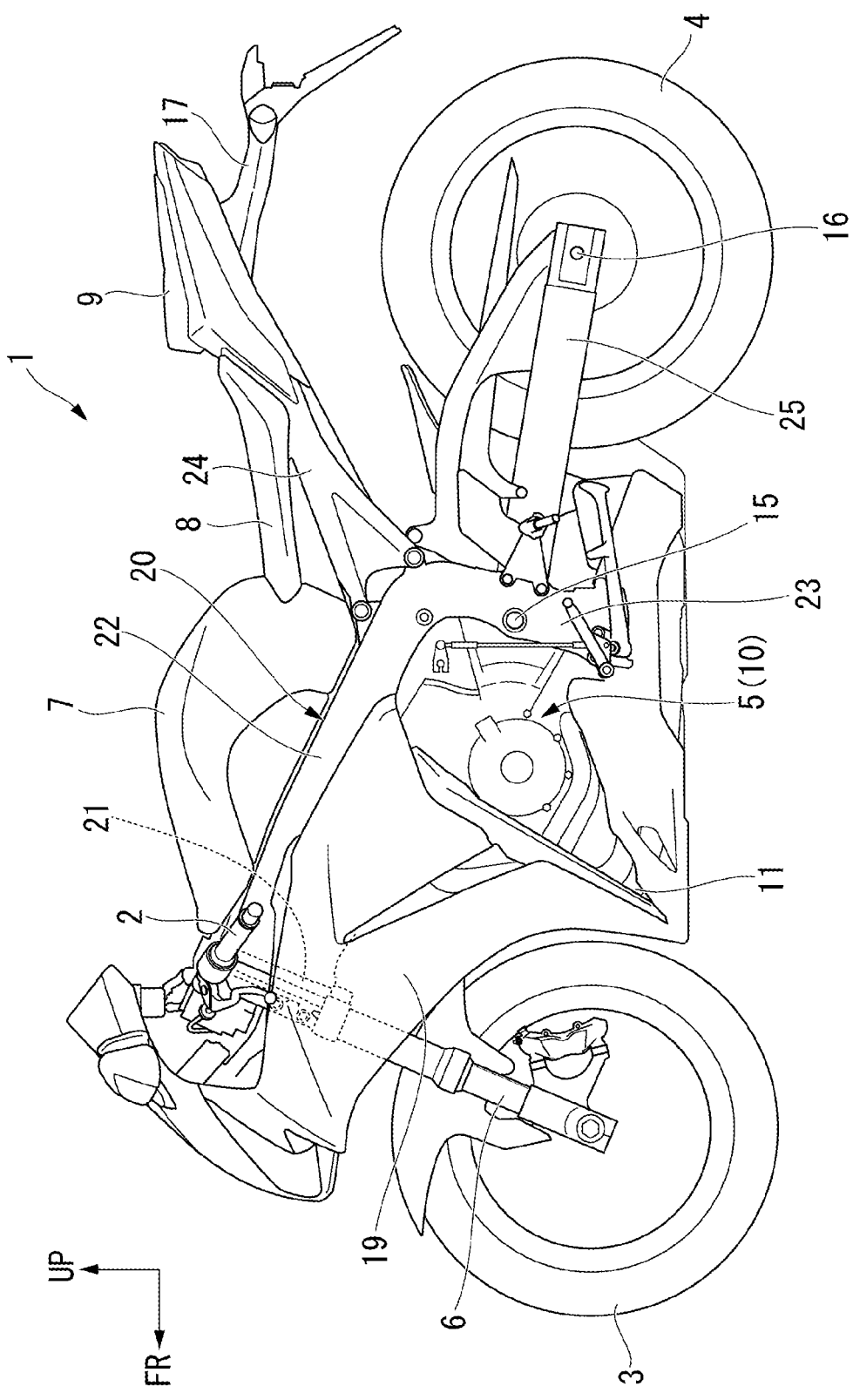
FIG. 1 is a left side view of a motorcycle according to an embodiment.

Hereinafter, an embodiment of the present invention will be described with reference to the drawings. Directions such as forward, rearward, left and right in the following description are the same as those in a vehicle described below unless otherwise specified. Further, an arrow FR which indicates a forward direction with respect to the vehicle, an arrow LH which indicates a leftward direction with respect to the vehicle, and an arrow UP which indicates an upward direction with respect to the vehicle are shown at appropriate places in the drawings used in the following description. A reference numeral CL in the drawings indicates a center line of a vehicle body in the right and left direction.

<Whole Vehicle>

FIG. 1 shows a motorcycle 1 as an example of a saddle riding-type vehicle. Referring to FIG. 1, the motorcycle 1 includes a front wheel 3 which is steered by a handle 2 and a rear wheel 4 which is driven by a power unit 5 including a power source. Hereinafter, the motorcycle may be simply referred to as a "vehicle."

Steering system components including the handle 2 and the front wheel 3 are pivotally supported in a steerable manner by a head pipe 21 at a front end of a vehicle body frame 20. An outer periphery of the vehicle body frame 20 is covered with a vehicle body cover 19. In FIG. 1, a reference numeral 6 indicates a front fork which pivotally supports the front wheel 3.

The vehicle body frame 20 includes the head pipe 21 which supports the front fork 6 in a steerable manner, a pair of right and left main frames 22 which extend rearward and downward from the head pipe 21, a pair of right and left pivot plates 23 which extend downward from a rear portion of the main frame 22, and a pair of right and left seat rails 24 of which a front end portion is connected to the rear portion of the main frame 22 and extends upward and rearward.

The handle 2 is fixed to an upper portion of the front fork 6. A fuel tank 7 is disposed on the main frames 22. A front seat 8 on which a driver is seated is disposed on the seat rail 24 behind the fuel tank 7. A rear seat 9 on which a passenger is seated is disposed behind the front seat 8.

A parallel multi-cylinder engine 10 is suspended on the main frames 22. A reference numeral 11 in the drawing indicates an exhaust pipe connected to the engine 10. The exhaust pipe 11 curves downward from a front portion of the engine 10 and extends rearward.

A front end portion of a swing arm 25 is swingably supported via a support shaft 15 at an intermediate portion of the pivot plate 23 in a vertical direction. An axle 16 of the rear wheel 4 is rotatably supported at a rear end portion of the swing arm 25. A rear fender 17 is disposed above the rear wheel 4 with a space in between. The rear fender 17 extends rearward from below the seat rail 24.

<Control Unit Arrangement Structure>

Figure 2:
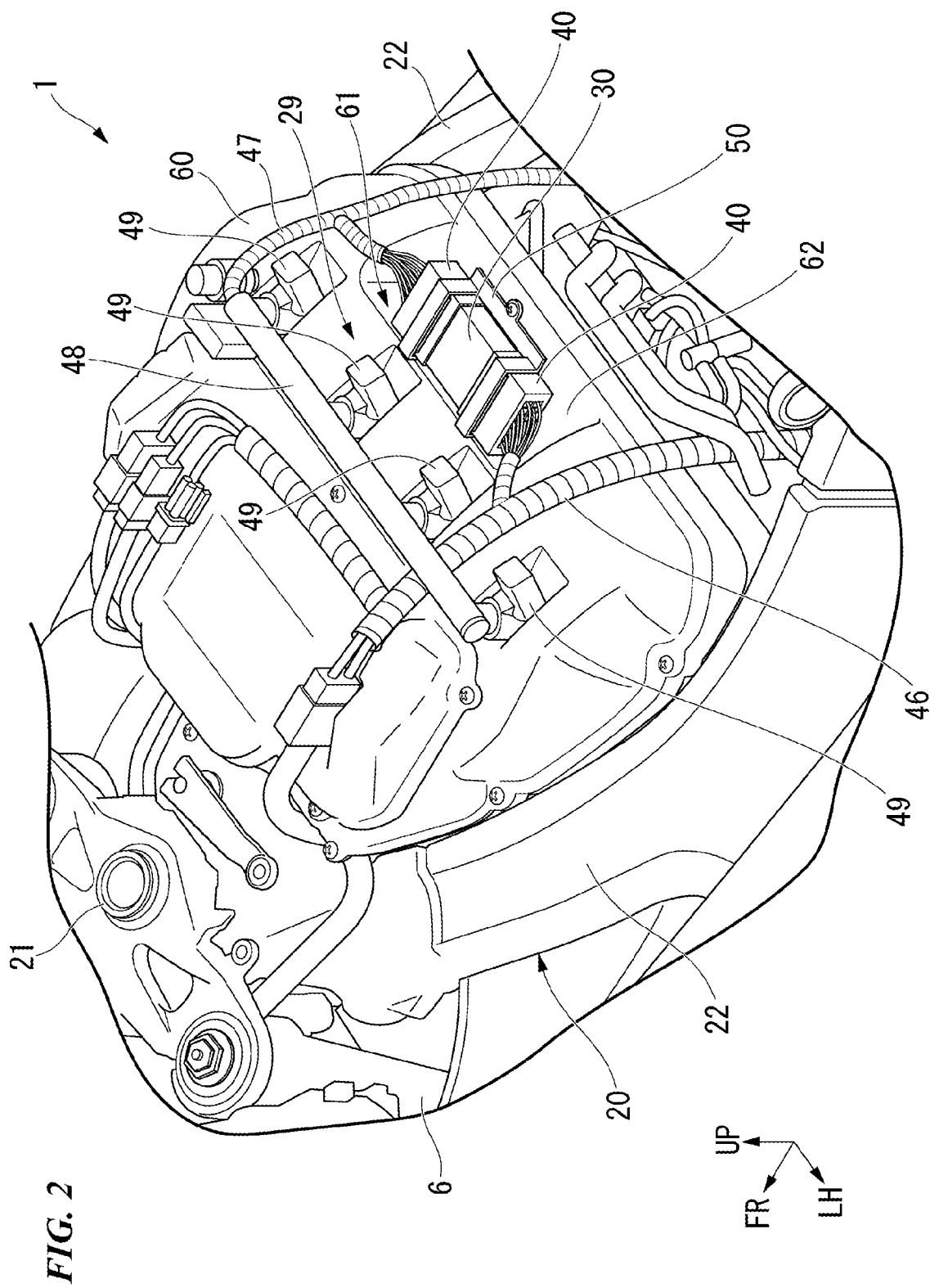
FIG. 2 is a perspective view of an upper portion of the motorcycle according to the embodiment when seen from the upper left side.

As shown in FIG. 2, a control unit arrangement structure 29 including an engine control unit 30 (hereinafter, also referred to as "ECU 30") which is a control unit is provided on the upper portion of the vehicle. The control unit arrangement structure 29 includes the ECU 30, a plurality of (for example, two in the embodiment) connectors 40 connected to the ECU 30, a support member 50 which supports the two connectors 40, and an air cleaner 60 disposed above an engine.

<ECU>

Figure 4:
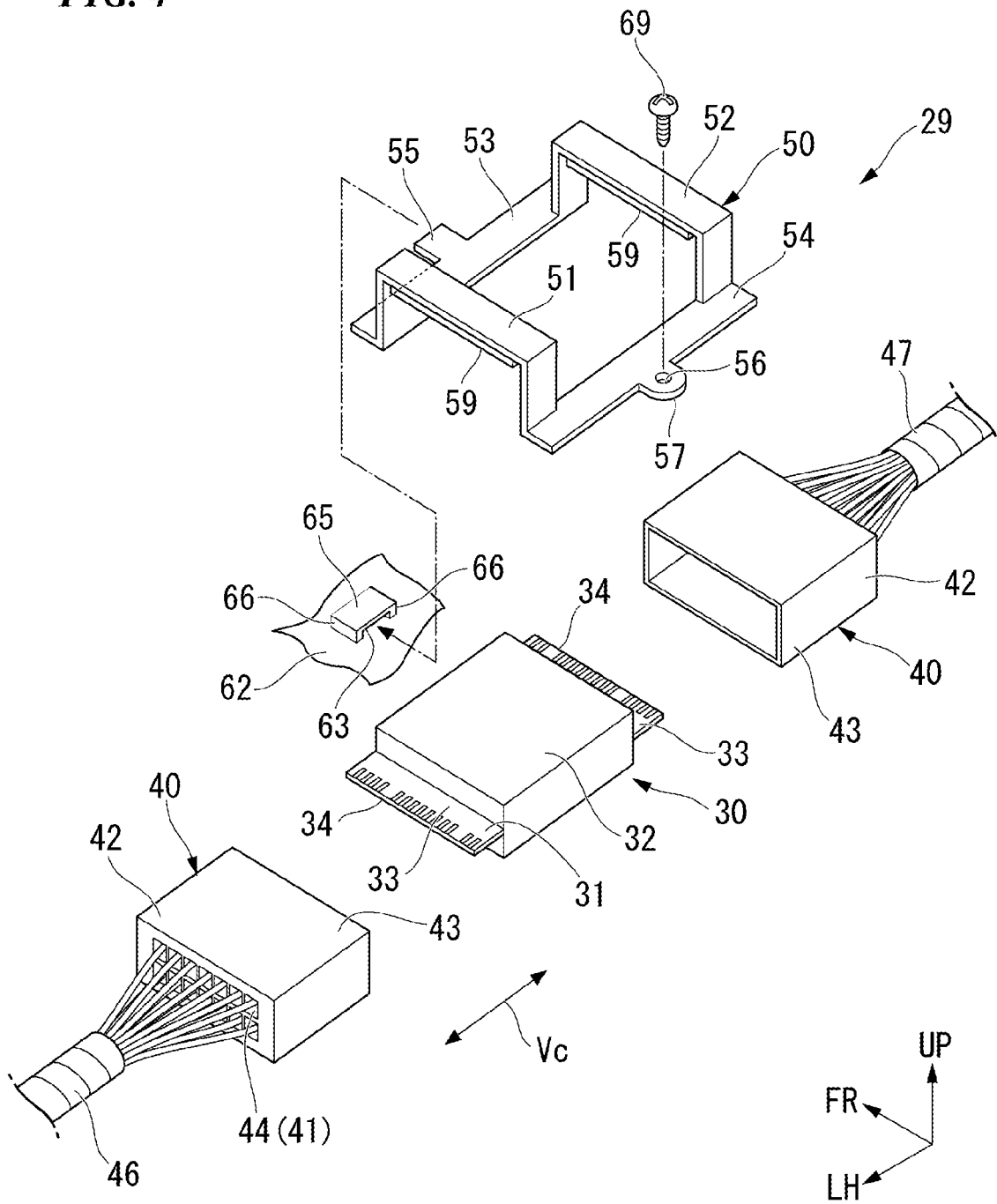
FIG. 4 is an exploded perspective view of a control unit arrangement structure according to the embodiment.

The ECU 30 controls ignition timing, fuel injection timing, an idle speed, an exhaust gas reduction amount, and so on of the engine 10 (refer to FIG. 1) on the basis of signals from various sensors. As shown in FIG. 4, the ECU 30 has a structure in which a circuit board 31 on which electronic circuit components are mounted includes a card edge terminal 34 for detachable electrical connection with an external device.

The ECU 30 includes a circuit board 31, an electronic circuit component (not shown) mounted on the circuit board 31, and a sealing member 32 which covers the electronic circuit component and integrates the circuit board 31 with the electronic circuit component. A board end region 33 which protrudes laterally from the sealing member 32 in the right and left directions is provided at the circuit board 31.

The card edge terminal 34 which serves as a joining part which transmits an electric signal is provided in the board end region 33. The card edge terminal 34 makes detachable electrical connection with the connector 40. The card edge terminal 34 is provided in each of the right and left board end regions 33. For example, the sealing member 32 is made of an insulating material such as a resin material.

As shown in FIG. 2, the ECU 30 is provided in an upper rear portion of the air cleaner 60. The ECU 30 is disposed on the side (that is, the upper side) of the air cleaner 60 opposite to the engine side (that is, the lower side). Thus, when compared to a case in which the ECU 30 is disposed on the engine side of the air cleaner 60, the ECU 30 can be kept away from the engine 10 (refer to FIG. 1) which is a heat source.

Figure 3:
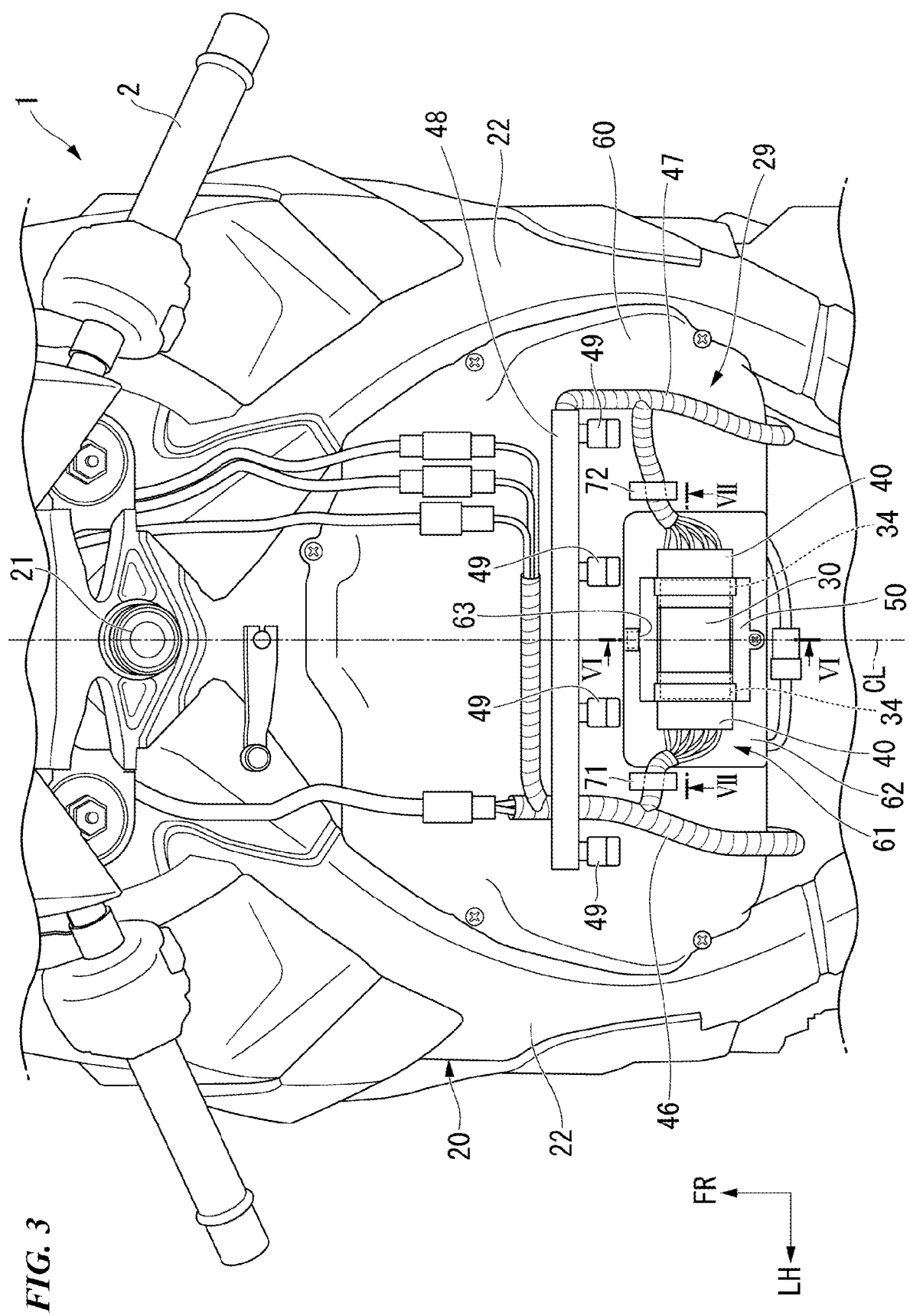
FIG. 3 is a top view of the motorcycle according to the embodiment.

In a top view of FIG. 3, the ECU 30 is disposed at a center position of the vehicle. In the top view of FIG. 3, a center portion of the ECU 30 is disposed at a position at which it overlaps the center line CL of the vehicle body in the right and left directions. The ECU 30 has a rectangular shape in the top view of FIG. 3. Hereinafter, among sides of the ECU 30, a side on the front side is also referred to as a "front side," a side on the rear side is referred to as a "rear side," a side on the left side is referred to as a "left side," and a side on the right side is referred to as a "right side."

As shown in FIG. 4, the ECU 30 includes a plurality of (for example, two in the embodiment) card edge terminals 34 (the joining parts) which transmit electric signals. The two card edge terminals 34 are connected to the two connectors 40. The two card edge terminals 34 are disposed on the left side and the right side of the ECU 30 which are sides facing each other. In the embodiment, the card edge terminals 34 are not provided on the front side and the rear side of the ECU 30. An outer periphery of the ECU 30 is disposed inward from an outer periphery of the connector 40 when seen in a connection direction Vc (a vehicle width direction) between the card edge terminal 34 and the connector 40.

<Connector>

Figure 7:
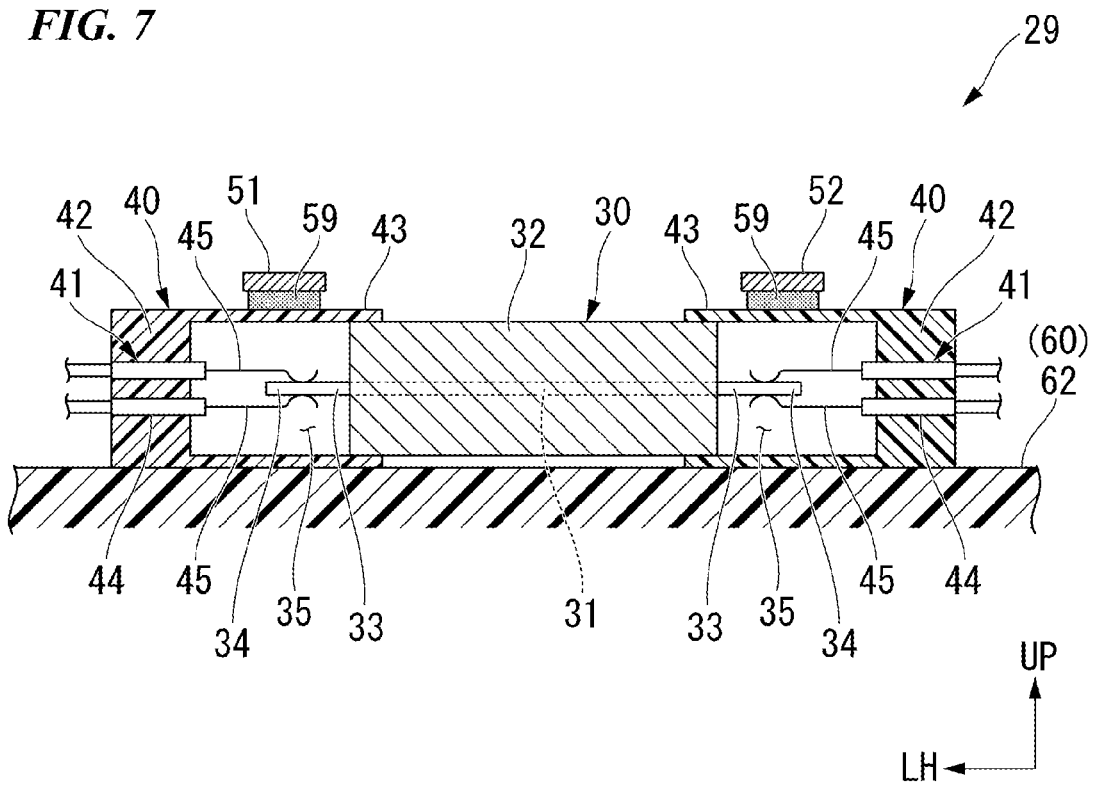
FIG. 7 is a view including a cross section taken along line VII-VII of FIG. 3.

The connector 40 electrically connects the ECU 30 to an external device by being connected to the card edge terminal 34. As shown in FIG. 7, the connector 40 includes a connection terminal 41 which is connectable to the card edge terminal 34, a body part 42 which holds the connection terminal 41, and an outer peripheral frame part 43 which extends from the body part 42 and into which an outer peripheral portion of the ECU 30 (an outer peripheral portion of the sealing member 32) is fitted.

The connection terminal 41 includes a wire holding part 44 which holds a distal end of a lead wire of each of harnesses 46 and 47, and an elastic contact terminal 45 which is electrically connected to the wire holding part 44. The elastic contact terminal 45 extends from the wire holding part 44 toward the card edge terminals 34. A pair of elastic contact terminals 45 are provided to sandwich the card edge terminals 34 in the vertical direction. For example, the elastic contact terminal 45 is made of a metal material such as copper.

Figure 6:
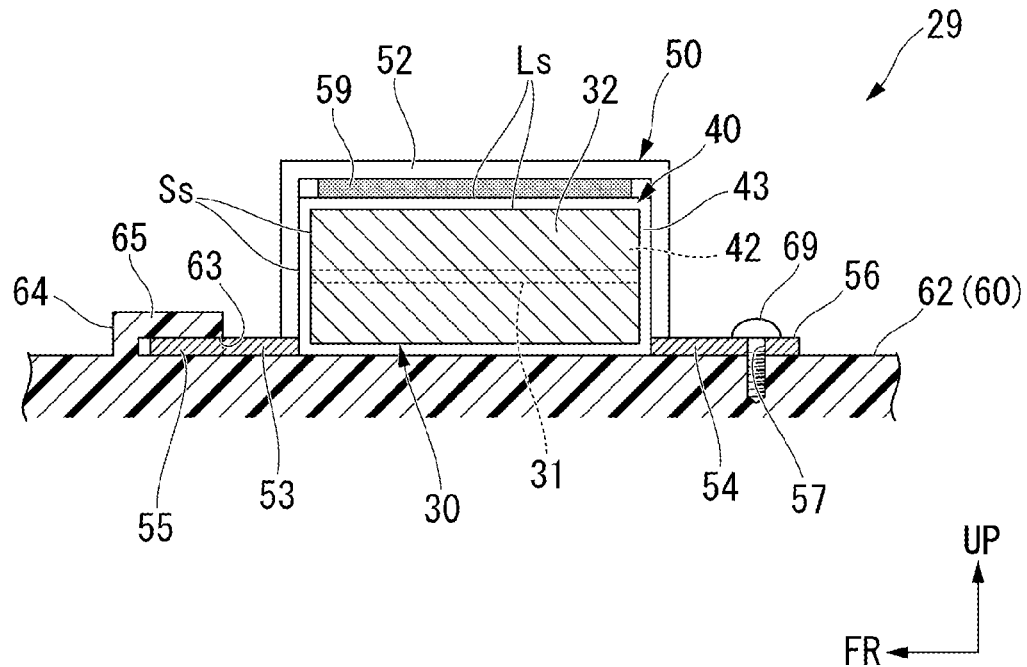
FIG. 6 is a view including a cross section taken along line VI-VI of FIG. 3.

In a cross-sectional view of FIG. 6, the body part 42 and the outer peripheral frame part 43 have exteriors larger than that of the ECU 30. As shown in FIG. 7, the outer peripheral frame part 43 extends from the body part 42 toward an outer peripheral portion of the sealing member 32 to cover the periphery of the elastic contact terminal 45. An extending end of the outer peripheral frame part 43 is located inward from a tip end of the elastic contact terminal 45 in the vehicle width direction.

As shown in FIG. 3, the two connectors 40 are disposed on the right and left sides of the ECU 30. Hereinafter, the one of the two connectors 40 disposed on the left side of the ECU 30 will also be referred to as a "left connector 40," and the other connector 40 disposed on the right side will also be referred to as a "right connector 40."

In FIG. 3, a reference numeral 46 indicates a frame function harness which connects various sensors mounted in the vehicle body frame 20 to the left connector 40, a reference numeral 47 indicates an engine function harness which connects various sensors mounted in the engine 10 (refer to FIG. 1) to the right connector 40, a reference numeral 48 indicates a fuel delivery pipe, and a reference numeral 49 indicates a fuel injector.

<Support Member>

The support member 50 is formed of a single member which supports the two connectors 40. For example, the support member 50 is made of a metal material. For example, the support member 50 is formed by bending a metal plate.

Figure 5:
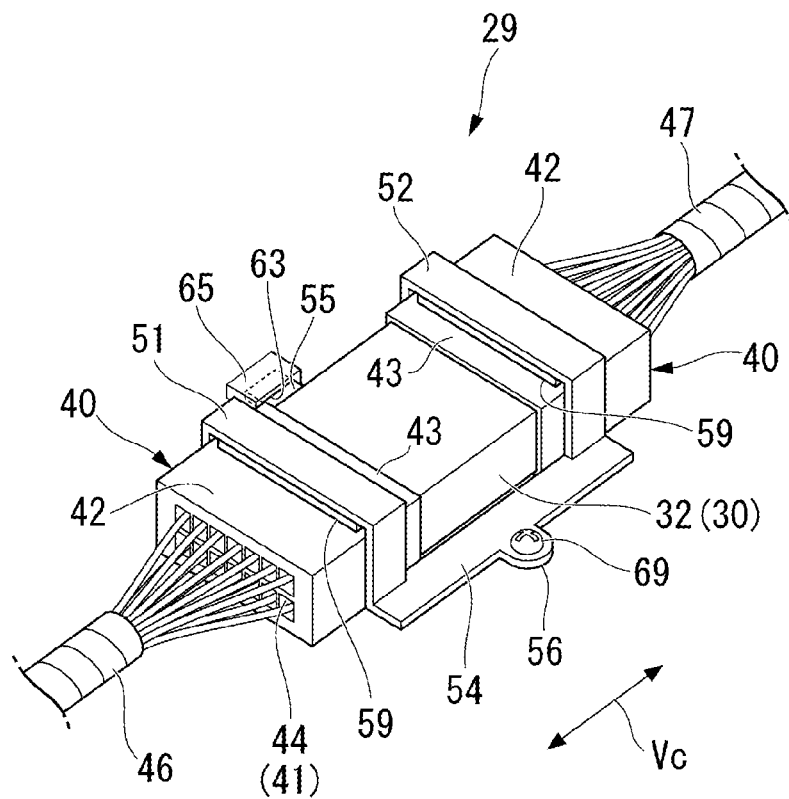
FIG. 5 is a perspective view of the control unit arrangement structure according to the embodiment when seen from the upper left side.
Figure 5:
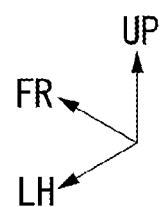

In a cross-sectional view of FIG. 6 (seen in the connection direction Vc of FIG. 5), each of the ECU 30 and the connector 40 has a long side Ls and a short side Ss. In the cross-sectional view of FIG. 6, the support member 50 is disposed to overlap the long side Ls of the connector 40. In the embodiment, the support member 50 is disposed to overlap each of the long side Ls and the short side Ss of the connector 40.

As shown in FIG. 4, the support member 50 includes an inverted U-shaped left support plate 51 which supports the left connector 40, an inverted U-shaped right support plate 52 which is separated from the left support plate 51 in the vehicle width direction and supports the right connector 40, a front connection plate 53 which extends in the vehicle width direction and connects a front lower end of the left support plate 51 to a front lower end of the right support plate 52, and a rear connection plate 54 which extends parallel to the front connection plate 53 and connects a rear lower end of the left support plate 51 to a rear lower end of the right support plate 52. The left support plate 51, the right support plate 52, the front connection plate 53, and the rear connection plate 54 are integrally formed of the same member.

As shown in FIG. 7, each of the left support plate 51 and the right support plate 52 supports the outer peripheral frame parts 43 of the connectors 40. In a cross-sectional view of FIG. 7, each of the support plates 51 and 52 is disposed at a center of the outer peripheral frame part 43 of each of the connectors 40. In the cross-sectional view of FIG. 7, each of the support plates 51 and 52 is disposed between the ECU 30 and the body part 42 in the vehicle width direction. In the cross-sectional view of FIG. 7, each of the support plates 51 and 52 is disposed at a position at which it avoids the ECU 30 and the body part 42. In the cross-sectional view of FIG. 7, each of the support plates 51 and 52 is disposed at a position at which it overlaps an accommodation space 35 of the card edge terminal 34.

An elastic member 59 is mounted on each of the support plates 51 and 52. For example, the elastic member 59 is made of rubber, sponge, or the like. As shown in FIG. 6, the elastic member 59 is provided at a portion of each of the support plates 51 and 52 (only the right support plate 52 is shown in FIG. 6) at which it overlaps the long side Ls of each of the connectors 40. The elastic member 59 is disposed between each of the support plates 51, 52 and each of the connectors 40 in the vertical direction. As shown in FIG. 7, the elastic member 59 is disposed to be received within a width of each of the support plates 51 and 52.

As shown in FIG. 4, a convex part 55 (hereinafter also referred to as "front convex part 55") for positioning the support member 50 is provided on the front connection plate 53. The front convex part 55 protrudes forward from a center of a front portion of the front connection plate 53.

A rear convex part 56 for fixing the support member 50 is provided on the rear connecting plate 54. An insertion hole 57 which opens so that a shaft part of a bolt 69 can be inserted thereinto is provided in the rear convex part 56.

<Air Cleaner>

As shown in FIG. 2, the air cleaner 60 is disposed to cover the engine 10 (refer to FIG. 1), which is a heat source, from above. An upper portion of the air cleaner 60 bulges above the right and left main frames 22. A concave part 61 which is recessed to accommodate the ECU 30 and the two connectors 40 is provided in an upper rear portion of the air cleaner 60. A mounting region 62 on which the ECU 30, the two connectors 40, and the single support member 50 are mounted is provided at the concave part 61. In the top view of FIG. 3, the mounting region 62 has a rectangular shape having a long length in the vehicle width direction.

As shown in FIG. 6, a second concave part 63 which is recessed to accommodate the front convex part 55 of the support member 50 is provided in the upper rear portion of the air cleaner 60. The second concave part 63 is disposed in a front portion of the mounting region 62. In the cross-sectional view of FIG. 6, a formation part of the second concave part 63 includes an upright part 64 which is upright upward from the mounting region 62, and a rearward extending part 65 which extends rearward from an upper end of the upright part 64. In the cross-sectional view of FIG. 6, a vertical distance between the rearward extending part 65 and the mounting region 62 coincides with an opening distance of the second concave part 63. Since the front convex part 55 of the support member 50 is accommodated in the second concave part 63, and thus the front convex part 55 is sandwiched between the rearward extending part 65 and the mounting region 62 in the vertical direction, the support member 50 can be positioned in the vertical direction.

As shown in FIG. 4, the formation part of the second concave part 63 further includes a pair of right and left side wall parts 66 which connect right and left ends of the rearward extending part 65 to the mounting region 62. Since the front convex part 55 of the support member 50 is accommodated in the second concave part 63, and thus the front convex part 55 is sandwiched between the right and left side wall parts 66, the support member 50 can be positioned in the vehicle width direction. In addition, since the front connection plate 53 of the support member 50 is in contact with rear ends of the right and left side wall parts 66, the support member 50 can be positioned in the forward and rearward direction.

As shown in FIG. 3, a first pressing member 71 which presses the frame function harness 46 and a second pressing member 72 which presses the engine function harness 47 may be provided on the upper rear portion of the air cleaner 60. Since each of the frame function harness 46 and the engine function harness 47 is pressed on the air cleaner 60, and thus vibration phases of the frame function harness 46 and the engine function harness 47 are the same as each other, it is possible to make the structure more resistant to vibration.

As described above, the control unit arrangement structure 29 of the above-described embodiment includes the ECU 30 mounted in the motorcycle 1 and the two connectors 40 connected to the ECU 30, the ECU 30 includes the two card edge terminals 34 which transmit electric signals, the two card edge terminals 34 are respectively connected to the two connectors 40, the outer periphery of the ECU 30 is disposed inward from the outer periphery of the connector 40 when seen in the connection direction Vc between the card edge terminal 34 and the connector 40 and includes the single support member 50 which supports the two connectors 40.

With such a constitution, since the single support member 50 which supports the two connectors 40 is provided, and thus the vibration phases of the two connectors 40 are the same as each other, resonance of each of the connectors 40 is curbed. Thus, the ECU 30 is restrained from moving with respect to each of the connectors 40. Therefore, vibration resistance performance of the ECU 30 can be improved.

Further, in the above-described embodiment, since the support member 50 is disposed to overlap the long side Ls of the connector 40 when seen in the connection direction Vc between the card edge terminal 34 and the connector 40, the following effect is achieved. Since the support member 50 can support a wide range of the connector 40, the resonance of each of the connectors 40 can be curbed more effectively.

Further, in the above-described embodiment, since the support member 50 is disposed to overlap each of the long side Ls and the short side Ss of the connector 40 when seen in the connection direction Vc, the following effect is achieved. The resonance of each of the connectors 40 can be curbed more effectively as compared with the case in which the support member 50 is disposed to overlap only the long side Ls of the connector 40. That is, it is effective in curbing vibration in all directions.

Further, in the above-described embodiment, since the ECU 30 has a rectangular shape in a top view, and the two card edge terminals 34 are respectively disposed on facing sides of the ECU 30, the following effect is achieved. As compared to the case in which the two card edge terminals 34 are disposed only on one side of the ECU 30, the ECU 30 can be stably supported.

Further, in the above-described embodiment, since the ECU 30 is disposed at the center position of the vehicle in a top view, and the two connectors 40 are disposed on the right and left sides of the ECU 30, the following effect is achieved. As compared with the case in which the ECU 30 is disposed at a position deviated from the center position of the vehicle in the top view, wiring lengths of the right and left harnesses 46 and 47 connected to the respective connectors 40 can be shortened. In addition, a weight balance of the vehicle in a right and left direction can be improved.

Further, in the above-described embodiment, since the ECU 30 further includes the air cleaner 60 disposed above the engine 10, and the ECU 30 is provided on the upper portion of the air cleaner 60, the following effect is achieved. Since the ECU 30 can be kept away from the engine 10, a heat effect on the ECU 30 can be curbed.

Further, in the above-described embodiment, the concave part 61 which is recessed to accommodate the ECU 30 and the two connectors 40 is provided in the upper portion of the air cleaner 60, the following effect is achieved. The positioning can be easily performed by accommodating the ECU 30 and the two connectors 40 in the concave part 61.

Further, in the above-described embodiment, since the front convex part 55 which positions the support member 50 is provided on the support member 50, and the second concave part 63 which is recessed to accommodate the front convex part 55 is provided in the upper portion of the air cleaner 60, the following effect is achieved. The positioning can be easily performed by accommodating the front convex part 55 in the second concave part 63.

Further, in the above-described embodiment, although the example in which the ECU 30 is provided at the air cleaner 60 has been described, the present invention is not limited thereto. For example, the ECU 30 may be provided on the vehicle body frame 20. For example, the ECU 30 may be provided on a bracket mounted on the vehicle body frame 20. For example, the ECU 30 may be provided in a vehicle component other than the air cleaner 60.

Further, in the above-described embodiment, although the example in which the support member 50 is disposed to overlap the long side Ls and the short side Ss of the connector 40 when seen in the connection direction Vc has been described, the present invention is not limited thereto. For example, the support member 50 may be disposed to overlap only the long side Ls of the connector 40 when seen in the connection direction Vc. For example, the support member 50 may be disposed to overlap only the short side Ss of the connector 40 when seen in the connection direction Vc.

Further, in the above-described embodiment, although the example in which the two card edge terminals 34 are disposed on facing sides of the ECU 30 has been described, the present invention is not limited thereto. For example, the two card edge terminals 34 may be disposed only on one side of the ECU 30.

Further, in the above-described embodiment, although the example in which the two card edge terminals 34 are respectively disposed on the right side and left side of the ECU 30 has been described, the present invention is not limited thereto. For example, the two card edge terminals 34 may be disposed on each of the front side and the rear side of the ECU 30.

Further, in the above-described embodiment, although the example in which the ECU 30 has a rectangular shape in a top view has been described, the present invention is not limited thereto. For example, the ECU 30 may have a polygonal shape other than a rectangle in the top view. For example, the ECU 30 may have a circular shape or an elliptical shape in the top view. The shape of the ECU 30 may be various shapes in accordance with required specifications.

Further, in the above-described embodiment, although the example in which the ECU 30 is disposed at the center position of the vehicle in a top view has been described, the present invention is not limited thereto. For example, the ECU 30 may be disposed at a position deviated from the center position of the vehicle in the top view.

Further, in the above-described embodiment, although the example in which the two connectors 40 are respectively disposed on the right and left sides of the ECU 30 has been described, the present invention is not limited thereto. For example, the two connectors 40 may be respectively disposed in front of and behind the ECU 30. The arrangement position of the connector 40 may be changed in accordance with the arrangement position of the card edge terminal 34 in the ECU 30.

Further, in the above-described embodiment, although the example in which the ECU 30 includes the two card edge terminals 34 has been described, the present invention is not limited thereto. For example, the ECU 30 may include three or more card edge terminals 34.

Further, in the above-described embodiment, although the example in which the control unit arrangement structure 29 includes the two connectors 40 connected to the ECU 30 has been described, the present invention is not limited thereto. For example, the control unit arrangement structure 29 may include three or more connectors 40.

Further, in the above-described embodiment, although the example in which the concave part 61 is provided in the upper rear portion of the air cleaner 60 has been described, the present invention is not limited thereto. For example, the concave part 61 may be provided in an upper front portion of the air cleaner 60. For example, the concave part 61 may be provided on an upper side portion of the air cleaner 60. That is, the concave part 61 may be provided in the upper portion of the air cleaner 60.

Further, in the above-described embodiment, although the example in which the insertion hole 57 which opens so that the shaft part of the bolt 69 can be inserted is provided in the rear convex part 56 of the support member 50 has been described, the present invention is not limited thereto. For example, a locking claw which can be locked to the upper portion of the air cleaner 60 may be provided on the rear convex part 56.

Figure 8:
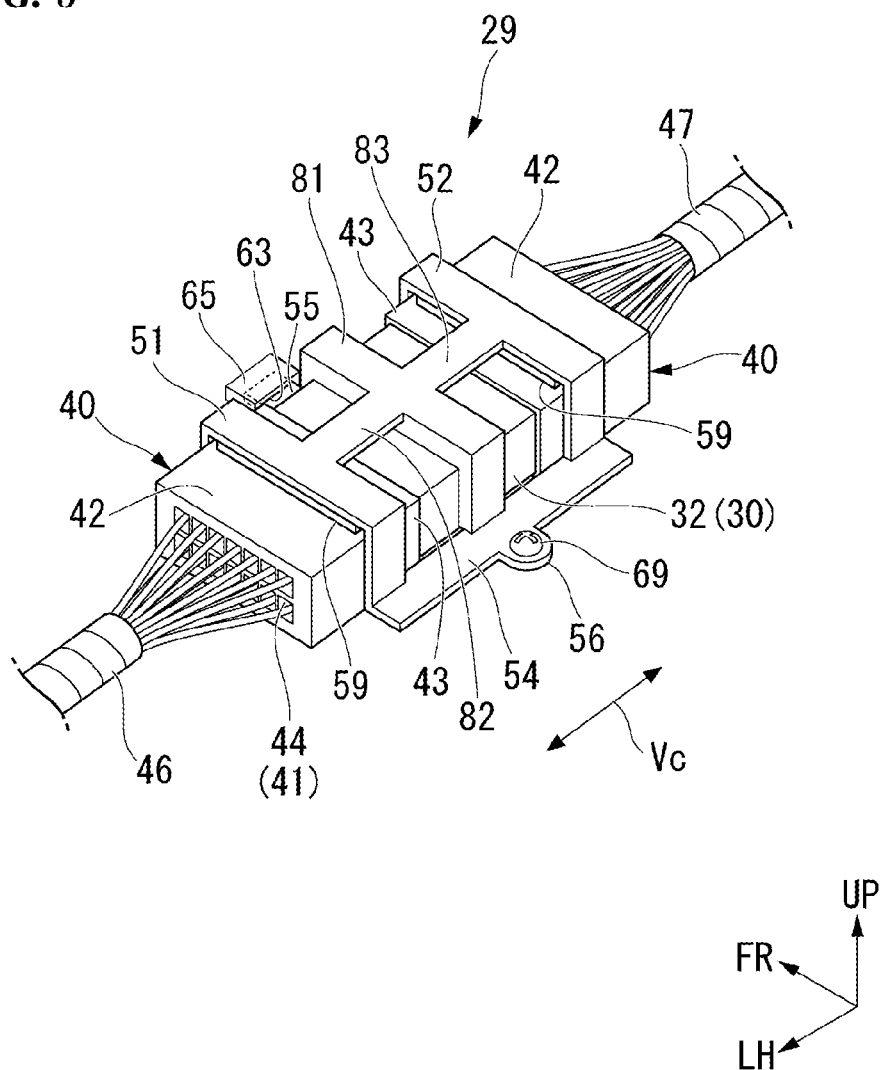
FIG. 8 is a perspective view which corresponds to FIG. 5 and shows a support member according to a modified example of the embodiment.

Further, in the above-described embodiment, although the example in which the support member 50 includes the left support plate 51 which supports the left connector 40, the right support plate 52 which supports the right connector 40, the front connection plate 53, and the rear connection plate 54 has been described, the present invention is not limited thereto. For example, as shown in FIG. 8, the support member may further include an ECU support plate 81 which supports the ECU 30.

The ECU support plate 81 is disposed between the left support plate 51 and the right support plate 52 in the vehicle width direction. The ECU support plate 81 has an inverted U shape along the contour shape of the ECU 30 (the sealing member 32). In FIG. 8, a reference numeral 82 indicates the left connection plate which extends in the vehicle width direction and connects the ECU support plate 81 to the left support plate 51, and a reference numeral 83 indicates the right connection plate which extends in an extending direction of the left connection plate 82 and connects the ECU support plate 81 to the right support plate 52.

The left support plate 51, the right support plate 52, the front connection plate 53, the rear connection plate 54, the ECU support plate 81, the left connection plate 82, and the right connection plate 83 may be integrally formed of the same member. That is, a single support member which supports the ECU 30 and the two connectors 40 may be provided. Thus, since the vibration phases of the ECU 30 and the two connectors 40 are the same as each other, it is possible to make the structure more resistant to vibration.

Further, in the above-described embodiment, although an example in which the control unit is the ECU 30 has been described, the present invention is not limited thereto. For example, the control unit may be a power control unit (PCU). For example, the control unit may be a voltage control unit (VCU). The control unit may employ a unit other than the ECU 30 in accordance with the required specifications.

The present invention is not limited to the above-described embodiment, and for example, the saddle riding-type vehicle includes all vehicles in which a driver rides over the vehicle body and includes not only motorcycles (including a motorized bicycle and a scooter type vehicle) but also three-wheeled vehicles (including front two-wheel and rear one-wheel as well as front one-wheel and rear two-wheel). The present invention is applicable not only to motorcycles but also to four-wheeled vehicles such as automobiles.

Additionally, the constitution in the above-described embodiment is an example of the present invention, and various modifications can be made without departing from the scope of the present invention, such as replacing the components of the embodiment with known components.

BRIEF DESCRIPTION OF THE REFERENCE SYMBOLS

1 Motorcycle (saddle riding-type vehicle)
10 Engine (heat source)
29 Control unit arrangement structure
30 ECU (control unit)
34 Card edge terminal (joining part)
40 Connector
50 Support member
55 Front convex part (convex part)
60 Air cleaner
61 Concave part
63 Second concave part
CL Center line of vehicle body in right and left direction (center position of vehicle)
Ls Long side
Ss Short side
Vc Connection direction

What is claimed is:

1. A control unit arrangement structure for a saddle riding-type vehicle comprising:
   a control unit mounted in a saddle riding-type vehicle; and
   a plurality of connectors connected to the control unit,
   wherein the control unit includes a plurality of joining parts which transmit electrical signals,
   the plurality of joining parts are connected to the plurality of connectors,
   an outer periphery of the control unit is disposed inward from an outer periphery of the plurality of connectors when seen in a connection direction between the plurality of joining parts and the plurality of connectors, and
   a single support member which supports the plurality of connectors is provided, further comprising an air cleaner disposed above a heat source,
   wherein the control unit is provided at an upper portion of the air cleaner, wherein;
   a convex part which positions the support member is provided on the support member, and
   a second concave part which is recessed to accommodate the convex part is provided in the upper portion of the air cleaner.

2. The control unit arrangement structure according to claim 1, wherein:
   each of the control unit and the plurality of connectors has a long side and a short side when seen in the connection direction, and
   the support member is disposed to overlap the long side of the plurality of connectors when seen in the connection direction.

3. The control unit arrangement structure according to claim 2, wherein the support member is disposed to overlap each of the long side and the short side of the plurality of connectors when seen in the connection direction.

4. The control unit arrangement structure according to claim 1, wherein:
   the control unit has a rectangular shape in a top view, and
   the plurality of joining parts are disposed on facing sides of the control unit.

5. The control unit arrangement structure according to claim 1, wherein:
   the control unit is disposed at a center position of the vehicle in a top view, and
   the plurality of connectors are disposed on right and left sides of the control unit.

6. The control unit arrangement structure according to claim 1, wherein a concave part which is recessed to accommodate the control unit and the plurality of connectors is provided in the upper portion of the air cleaner.

* * * * *